United States Patent
Shim et al.

(10) Patent No.: US 6,455,871 B1
(45) Date of Patent: Sep. 24, 2002

(54) SIGE MODFET WITH A METAL-OXIDE FILM AND METHOD FOR FABRICATING THE SAME

(75) Inventors: Kyu Hwan Shim; Hong Seung Kim; Seung Yun Lee; Jin Yeoung Kang, all of Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 09/927,939

(22) Filed: Aug. 13, 2001

(30) Foreign Application Priority Data

Dec. 27, 2000 (KR) .............................. 00-82803

(51) Int. Cl.[7] .................. H01L 29/06; H01L 31/072; H01L 31/109; H01L 31/0328; H01L 31/0336
(52) U.S. Cl. ..................... 257/12; 257/19; 257/189; 257/190
(58) Field of Search .................. 430/47, 172, 933, 430/938; 257/12, 18, 19, 20, 183, 189, 190, 191, 192

(56) References Cited

U.S. PATENT DOCUMENTS

| | | | | |
|---|---|---|---|---|
| 5,442,205 A | * | 8/1995 | Brasen et al. | 257/12 |
| 5,461,243 A | * | 10/1995 | Ek et al. | 257/12 |
| 5,534,713 A | * | 7/1996 | Ismail et al. | 257/190 |
| 5,698,869 A | | 12/1997 | Yoshimi et al. | |
| 5,792,679 A | | 8/1998 | Nakato | |
| 5,891,769 A | * | 4/1999 | Liaw et al. | 438/167 |
| 6,059,895 A | * | 5/2000 | Chu et al. | 148/33.1 |
| 6,350,993 B1 | * | 2/2002 | Chu et al. | 257/18 |

OTHER PUBLICATIONS

Sadek, et al.; *Design of Si/SiGe Heterojunction Complementary Metal–Oxide–Semiconductor Transistors;* IEEE Transactions on Electron Devices, vol. 43, No. 8, Aug. 1996, pp. 1224–1232.

* cited by examiner

*Primary Examiner*—Olik Chaudhuri
*Assistant Examiner*—Hoai Pham
(74) *Attorney, Agent, or Firm*—Jacobson Holman, PLLC

(57) ABSTRACT

There is disclosed a method for fabricating a SiGe MODFET device using a metal oxide film. The present invention provides a SiGe MODFET device with improved operation speed and reduced non-linear operation characteristic caused in a single channel structure devices, by increasing the mobility of the carriers in the SiGe MODEFT having a metal-oxide gate, and method of fabricating the same. In order to accomplish the above object, the present invention grows a silicon buffer layer and a SiGe buffer layer on a silicon substrate by low-temperature process, so that defects caused by the mismatch of the lattice constants being applied to the epitaxial layer from the silicon substrate are constrained in the buffer layered formed by the low-temperature process.

9 Claims, 5 Drawing Sheets

SIGE MODFET WITH A METAL-OXIDE FILM AND METHOD FOR FABRICATING THE SAME

TECHNICAL FIELD

The invention relates generally to a SiGe MODFET with a metal-oxide gate and method fabricating the same. More particularly, the present invention relates to a technology for improving the operation speed of a SiGe MODFET and reducing its non-linear operation characteristic caused by single channel, by increasing the mobility of carriers in the SiGe MODEFT with a metal-oxide film.

BACKGROUND OF THE INVENTION

In recent CMOS technology, the line width is reduced to 130 nm and the storage capacity of 1 G-byte has been achieved. With continued development efforts, around the year of 2012, the minimum line width will be reduced to 35 nm and the integration level will reach at $10^{10}$ cm$^{-2}$. At the same time, there have been a lot of efforts to implement system-on-chip by improving the function of CMOS in various ways in order to commercialize BiCMOS including a SiGe HBT (Hetero-structure bipolar transistor). Meanwhile, efforts have been actively made to accomplish intra-chip and inter-chip communication through implementation of photoelectric integration circuits incorporating photoelectric devices to silicon integration circuits. As the chip scale has reach a degree in which control using classical physics and statistics becomes very difficult, it has been found that the conventional technology could not control the repeatability and uniformity. Under these circumstances, next-generation semiconductor technology for overcoming the problems has been in need.

FIG. 1 is a cross-sectional view illustrating the device structure of a conventional SiGe MODFET.

Referring now to FIG. 1, a thin silicon buffer film 120 is grown on a silicon substrate 110. Then, a SiGe channel layer 130 and a silicon cap layer 140 are grown on the thin silicon buffer film 120. Next, after a silicon insulating (or oxide) film 150 is deposited, gate 160 and source-drain 171 and 172 are sequentially formed. Although this type of MODFET can be easily manufactured, there is a problem that a channel is also formed in the silicon cap layer 140 due to an inversion phenomenon when a high gate-drain voltage is applied. In addition, as it is difficult to adjust the thickness of the silicon cap layer 140 remaining after the oxide film 150 is formed and to control diffusion of impurity through the oxide film 150, there are problems that the operational characteristic of the gate is not uniform and impurity or Ge is concentrated with high concentration at the interface between the oxide film 150 and the SiGe channel layer 130, which causes a leakage current and lowers reliability. Further, as a heterojunction is disturbed by high-temperature process, defects tend to generat at the interface between the SiGe channel layer 130 and the silicon cap layer 140. These problems pose a process constraint that the gate oxide film 150 must be formed at a low temperature.

As another example, there is a conventional method in which a base and a collector are self-aligned on the single-crystalline silicon substrate by means of SEG (selective epitaxial growth) and SOI (silicon-on-insulator) technology, and a hetero-junction structure of SiGe/Si/SiO$_2$ is formed by implanting Ge and then oxidizing the silicon. Although there is an advantage that the MODFET having a high concentration carrier can be easily manufactured by simple method, the method have the problem that defects tend to generate between the SOI and the epitaxial layer, and the problem caused by the high concentration ion implantation should be solved. Also, this method has limitations in fabricating devices because of the high-temperature annealing process used in the formation of SiGe and an oxide film.

SUMMARY OF THE INVENTION

The present invention is contrived to solve the above problems and an object of the present invention is therefore to provide a method of fabricating a SiGe MODFET with a metal oxide film gate which is capable of significantly improving the operation characteristics of device by preventing the leakage current caused by the mismatch of the lattice constant and by the precipitation of Ge during the formation of the oxide film. Another object of the invention is to eliminate the impurity diffusion problem of a high-temperature process by adopting a low-temperature process, especially for the eptaxial growth process. A semiconductor device according to the present invention has a structure fabricated by utilizing an epitaxial growth technology of atomic layers and by forming a gate oxide film having high-speed characteristic and excellent electrical characteristics. As the device is fabricated by the process compatible with conventional CMOS fabrication technology, it has a high reliability.

According to one aspect of the present invention, a SiGe MODEFT device including a silicon buffer layer, a SiGe channel layer and a silicon cap layer sequentially formed on a silicon substrate, being characterized by further comprising a second silicon buffer layer and a SiGe buffer layer sequentially formed between said silicon buffer layer and said SiGe channel layer a temperature lower than that is used to form said silicon buffer layer is provided.

According to another aspect of the invention, a method for fabricating a SiGe MODEFT device comprising a silicon buffer layer, a SiGe channel layer and a silicon cap layer sequentially formed on a silicon substrate, being characterized by comprising the steps of sequentially growing a second silicon buffer layer and a SiGe buffer layer between said silicon buffer layer and said SiGe channel layer, wherein said second buffer layer and said SiGe buffer layer are formed at a temperature lower than that is used to form said silicon buffer layer so that the defects caused by the mismatch of the lattice constants of each of said layers are constrained within said second buffer layer and said SiGe buffer layer is provided.

When a stress due to the difference of lattice constant is absent, the energy gaps of Si, Ge or SiC are 1.12 eV, 0.7 eV, and 2.3 eV, respectively, and their lattice constants are 5.43 Å, 5.64 Å, and 4.37 Å, respectively. When the impurity concentration below $10^{16}$ cm$^{-3}$, the mobility of electrons in silicon semiconductor is about 1500 cm$^2$/Vs. If the doping concentration is increased by 10~100 times, however, the mobility of electrons is reduced to about one over several hundredth of the above mobility. SiGe, however, has advantages that the electron mobility is high as ~2000 cm$^2$/Vs when the impurity concentration is $10^{18}$ cm$^{-3}$. In case of pseudo-morphic, as the collision area of carriers is reduced by transformation of band-gap, the mobility is increased to about 3000~4000 cm$^2$/Vs. Meanwhile, though the mobility of 3C-SiC is high as 4000 cm$^2$/Vs and stable, it should have a thickness smaller than the threshold thickness so that defects are not generated due to the difference of the lattice constant from silicon.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

The present invention will be described in detail by way of a preferred embodiment with reference to accompanying drawings.

Figure 1:
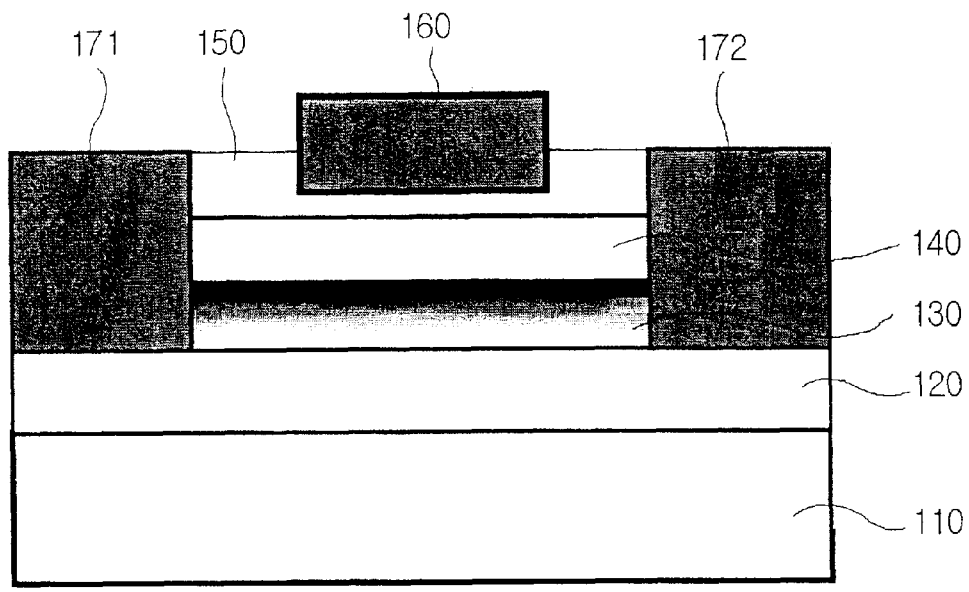
FIG. 1 is a cross-sectional view for illustrating a device structure of a conventional SiGe MODFET.
Figure 2A:
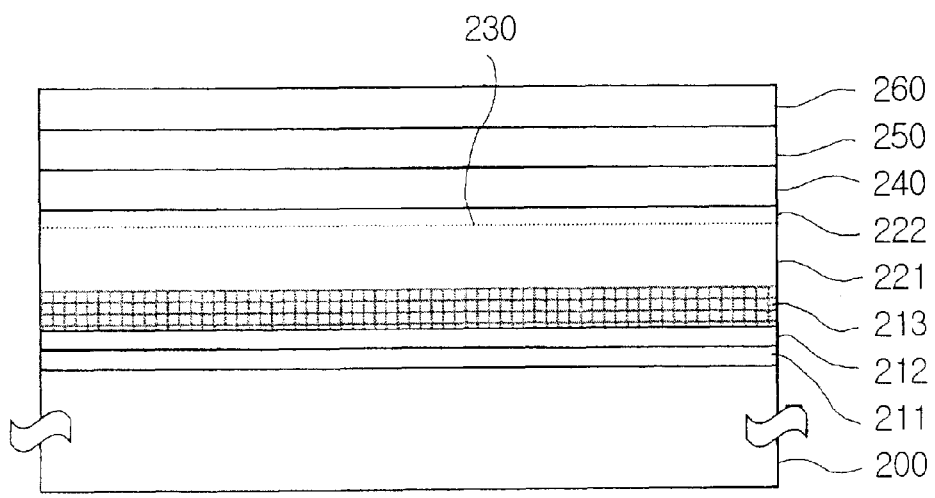
FIG. 2a is a cross-sectional view of a SiGe-MODFET that is epitaxially grown according to one embodiment of the present invention.
Figure 2B:
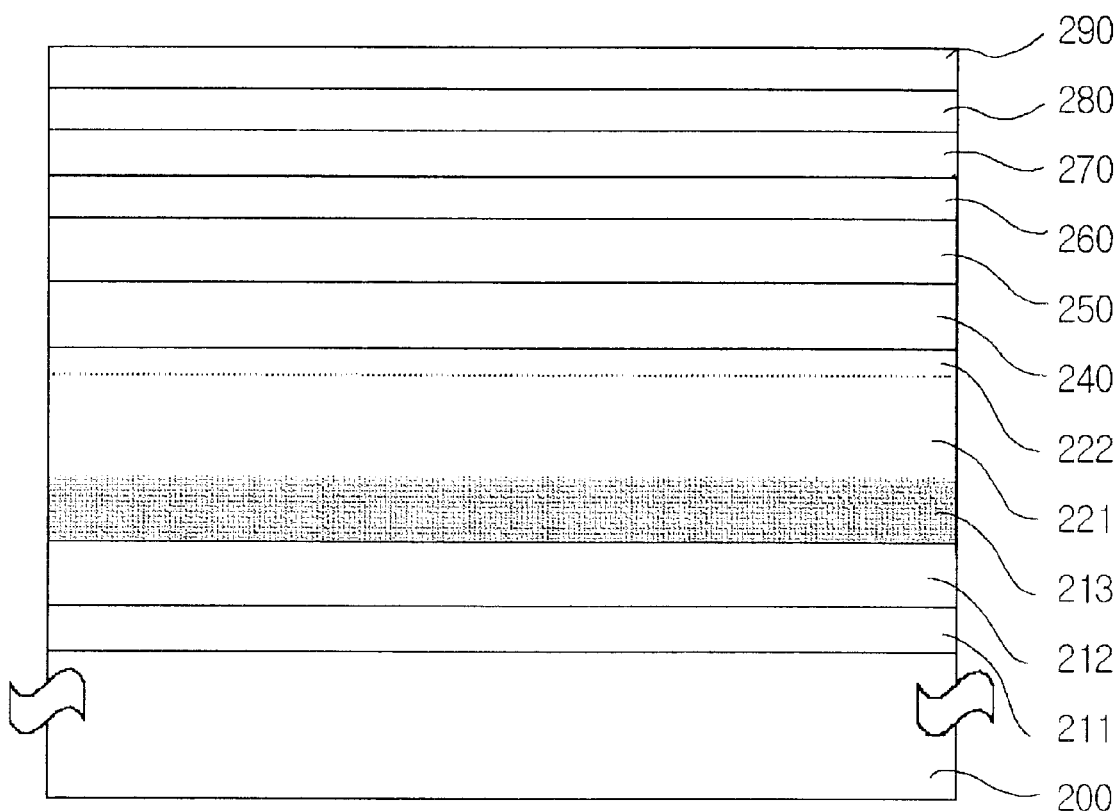
FIG. 2b is a schematic view illustrating the growth procedure of a gate poly layer and an insulating film that are fabricated according to one embodiment of the present invention.
Figure 3:
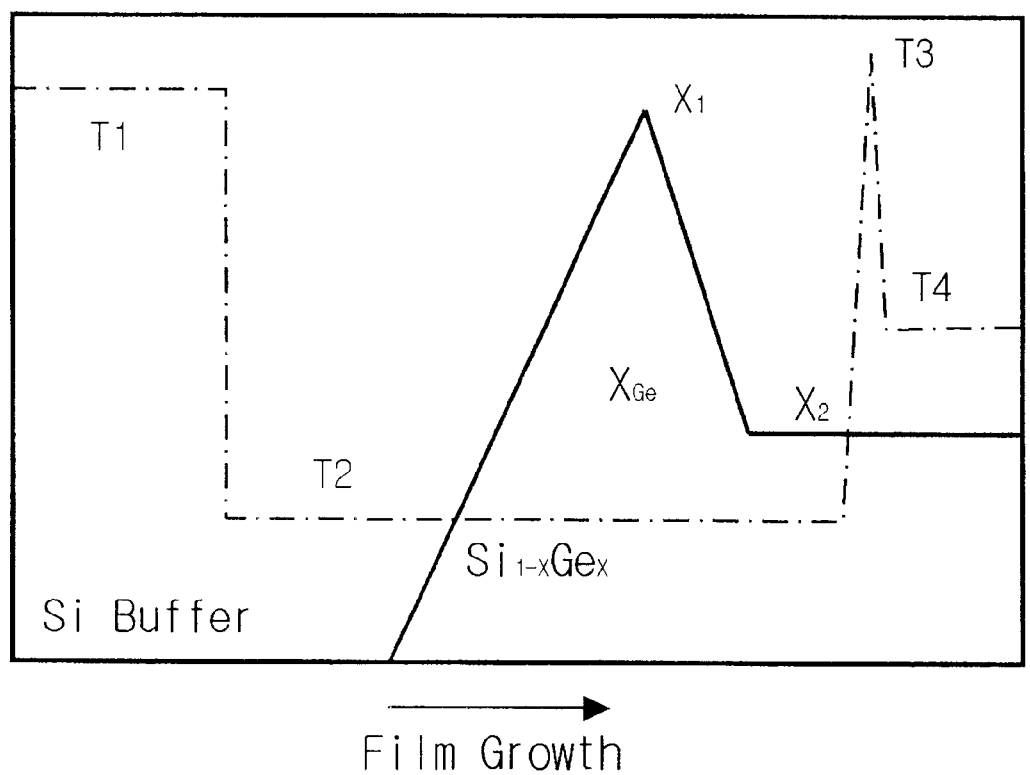
FIG. 3 is a schematic view of the growth procedure of a buffer layer by stress strain.

FIG. 2a is a cross-sectional view of a SiGe-MODFET that is epitaxially grown according to one embodiment of the present invention, FIG. 2b is a schematic view of illustrating the growth procedure of a gate poly layer and an insulating film that are fabricated according to one embodiment of the present invention, and FIG. 3 is a schematic view of the growth procedure of a buffer layer by stress strain.

Referring now to the above figures, the process of fabricating a SiGe MODFET begins by cleaning a silicon substrate 200 using $H_2SO_4/H_2O_2$ and $H_2O/HF$, RCA method, etc. In order to grow silicon and a SiGe epitaxial layer 221, various methods such as atmospheric pressure chemical vapor deposition method, low-pressure chemical vapor deposition method or ultra high vacuum chemical vapor deposition method are employed under complete hydrogen atmosphere. In order to grow the SiGe epitaxial layer 221, a oxide film of several atomic layers formed on the surface of the wafer while loading the wafer into the growth chamber is removed by performing annealing process under hydrogen atmosphere at the temperature of 900~1000° C. for more than 2 minutes. Then, the temperature and gas atmosphere are adjusted for growth. The growth apparatus includes rapid thermal process equipment such as a halogen lamp or a RF induction heater by which the SiGe epitaxial layer 221 having a complicated structure can be continuously grown.

In order to achieve epitaxial growth of high quality by minimizing the effect of the silicon substrate 200 and also increasing the insulating effect, the silicon buffer layer 211 is first grown with a thickness greater than 2 μm. At this time, silane ($SiH_4$), disilane ($Si_2H_6$) or dichlorosilane ($SiCl_2H_2$) may be used as a source gas of silicon. The silicon buffer layer 211 is grown at the growth rate greater than 1000 nm/min at a high temperature Ti (FIG. 3a) which is over 900° C. so that it can have the resistivity greater than 1000 ohm·cm. Then, the temperature is changed to a lower temperature T2 (FIG. 3a) at which the silicon buffer layer 212 is grown and then the SiGe buffer layer 213 is then grown. In the $Si_{1-x}Ge_x$ buffer layer 213, the mole fraction (x) of Ge is controlled to have an optimized value in the range of 0.3~0.5 so that defects do not propagate into the SiGe conduction layer 240.

When growing the $Si_{1-x}Ge_x$ buffer layer 213, if the mole fraction of Ge is 0.5, mismatch of the lattice constant becomes over 2%. Thus, while growing the SiGe buffer layer 213, heavy stress strain or crystallization disturbance caused by thermal shock occurs during a subsequent process. In other words, if the SiGe buffer layer 213 is grown in a single step, a lot of defects are transferred onto the surface of the epitaxial layer when the SiGe layer is thicker than a threshold thickness. Thus, the crystal in the surface becomes to have a very unstable state and defects propagate up to the upper portion where the device is located.

In order to prevent this problem, as shown in FIG. 3, a multi-step growth method is preferably employed. According to the method, when the $Si_{1-x}Ge_x$ buffer layer 213 is grown at T2, the mole fraction of Ge is gradually increased so that the stress due to the mismatch of the lattice constant can be relaxed. The multi-step growth method allows dislocations or defects to propagate only within the $Si_{1-x}Ge_x$ buffer layer 213 so that they may not propagate out of the surface of the $Si_{1-x}Ge_x$ buffer layer 213. Thus, a SiGe epitaxial layer 221 with a good quality can be grown on it below a SiGe conduction layer 240. That is, the method includes the steps of increasing the mole fraction of Ge from 0 to X1 while growing the crystal, reducing the mol fraction of Ge it from X1 to X2 immediately before reaching the threshold thickness, continuously growing SiGe epitaxial layer 221 having a thickness of 5~30 nm at X2, performing a rapid thermal process at T3 to generate a threading dislocation by which the accumulated stress can be concentrated between the silicon buffer layer 212 and the SiGe buffer layer 213. The electric potential generated at this time is transferred in the direction of the underlying silicon substrate. Simultaneously, the pressure stress applied to the upper SiGe epitaxial layer is controlled to be relaxed so that defects are constrained within the silicon buffer layer 212 is grown at low temperature, and the SiGe buffer layer 213. Finally, the interface of the epitaxial layer grown at a lower temperature T4 has the surface smoothness corresponding to 2~4 atomic layers.

As the scattering of the carrier is minimized because the interface of the SiGe conduction layer 240 and the SiGe:C space layer 250 is sharply defined, a good conductive characteristic and high frequency operation can be obtained. Also, as the non-uniform distribution of the carrier concentration is reduced, noise in the low frequency can be minimized. Especially, the SiGe epitaxial layer 221 and the SiGe conduction layer 240 are separated by a GeSi isolation layer 222 with a thickness of 5–12 nm and impurity of p-type or n-type is doped into the 2-dimensional carrier layer 230. A doping gas includes $B_2H_6$ gas or $PH_3$ gas diluted in hydrogen carrier gas. The concentration of the carrier is $(0.6~3) \times 10^{-}cm^{-2}$, and the mobility of electrons is controlled to be greater than 2600 $cm^2/Vs$. The 2-dimensional carrier layer 230 is formed with a distance of 3~10 nm from the channel layer so that most of the generated carrier can be easily moved to the SiGe conduction layer 240 according to the voltage variation of the gate. Also, the mole fraction of Ge which controls the non-continuity of the energy gap between the conduction layer 240 and the SiGe isolation layer 222 to be about 40~100 meV is $X_{Ge}$=0.1~0.2. In order to grow the 2-dimensional carrier layer 230, the temperature of the substrate is lowered by 100° C. than the growth temperature of the SiGe epitaxial layer 221 and the supply of silane and germane gas is suspended. Thus, the dopant gas is controlled to maintain the partial pressure of several hundred torr along with pure hydrogen, so that the concentration of impurity adhering to the surface of the SiGe epitaxial layer 221 may be controlled. After the growth of the 2-dimensional carrier layer 230, the SiGe isolation layer 222 is grown under the same condition as the original SiGe epitaxial layer 221, and the $Si_{1-x}Ge_x$ conduction layer 240 is then grown at the temperature of 400–650° C. At this time, the partial pressure of the $GeH_4$ is controlled in the range of 1~200 mTorr and $X_{Ge}$ varies within the range of 0.5~0. Further, when growing the SiGe conduction layer 240, in order to minimize the amount of carbon or oxygen that enters from the chamber into the epitaxial layer of the SiGe conduction layer 240, the partial pressure of hydrogen is increased to over one hundred times of the reaction gases.

If the growth of the $Si_{1-x}Ge_x$ conduction layer 240 is completed, the flow amount of $CH_4$ gas is controlled while increasing the temperature of the silicon substrate 200 to over 650° C., so that the SiGe:C layer 250 is grown with a thickness of 1–5 nm. At this time, the mole fractions of Ge and carbon are controlled to be below 0.2 and over 0.3, respectively, and their thickness are controlled, so that defects do not generate between the SiGe conduction layer 240 and the SiGe:C layer 250 and the extension stress applied by the mismatch of the lattice constant is relaxed. At this time, methane gas is dissolved using a plasma gas so that it can be grown at low temperature. The plasma source has a structure in which a radio wave induction coil using a radio frequency is installed. Methane gas of 1–6 sccm is supplied together with hydrogen gas so that the pressure of 40–200 mTorr can be maintained within the chamber. Also a voltage of 50–300 V is applied to the silicon substrate 200 so that ions of hydrogen and carbon generated in the plasma are accelerated to facilitate the surface reaction, and the combination of Si-C and Ge-C can be formed at a low temperature.

After the SiGe:C space layer 250 is grown, hydrogen gas of over 20 LPM is injected for more than 5 minutes so that $GeH_4$ and $CH_4$ can be sufficiently removed. Then, with the temperature of the substrate reduced lower than the temperature of 560° C., pure silane gas is diluted into hydrogen gas, so that the silicon cap layer 260 is grown at the partial pressure of below 1 mTorr. At this time, the growth rate is controlled to be below 5 nm/min and the thickness of the silicon cap layer 260 is precisely controlled to 2–5 nm.

Next, the silicon substrate 200 on-which the silicon cap layer 260 is formed is transferred into a chamber using oxygen atmosphere. The silicon substrate 200 is subjected to a rapid thermal process in oxygen atmosphere within the chamber, thus forming an oxide film 270 by oxidation process followed by an atomic layer deposition technique for metal-oxides, such as HfO, ZrSiO, $Ta_2O_5$, and $Al_2O_3$. The oxidation step is to insert a perfect oxide layer formed down to atomic layer by rapid thermal annealing, which plays a role of lowering the density of interfacial states. The advantage of metal-oxide film basically stems from the unique ability of creating high quality oxides at low-temperature in the virtue of atomic layer deposition. Then, a poly thin film 280 for a gate and a protection insulating film 290 are deposited. Details of this process are as follows.

By processing the surface of the oxide film 290 oxidized by means of a low-temperature rapid thermal process under hydrogen atmosphere at the temperature of 600~700° C., its interface is passivated by means of combination of hydrogen. Then, the poly thin film 280 for a gate is grown at the temperature of below 450° C. If the thickness of the amorphous SiGe layer 280 becomes over 50 nm, the temperature of the substrate 200 is increased to over 560° C. so that crystallization can be performed and the growth mode is changed into polycrystalline SiGe. When deposition of the gate poly thin film 280 is completed, an insulating film 290 such as a nitride film is deposited. Then, a low-temperature rapid thermal process is used for forming the oxide film 270 of single-crystalline silicon, so that the diffusion in the hetero-junction of SiGe/Si or segregation of Ge can be prevented. In other words, during the process of forming the gate insulating film 290 on the surface of the wafer at a low temperature, the reaction which generates Ge or Ge oxide at the interface can be substantially reduced since the implantation due to diffusion of oxygen into the thin film of Si, SiGe:C or SiGe/Si can be minimized. Therefore, as oxygen reaction can be prohibited by means of a strong atom combination force of Si—C and Ge—C, the thickness of the oxidization of the silicon cap layer 260 can be completely controlled. The content of carbon is adequately controlled to be over 1000 ppm so that there is no problem in the threshold voltage and the crystal property. These series of process can maintain the state obtained by the growth of epitaxial layer without lowering the mobility of carriers such as electrons or holes that move via the channel layer. Therefore, devices having high performance characteristics can be manufactured.

In the SiGe MODFET structure fabricated by the above process, the problem occuring in the SiGe conduction layer 240 can be prevented because the defects caused by the lattice constant mismatch, diffusion of impurity can be prevented due to the high-temperature stability of the SiGe:C space layer 250, and the degradation of the performance caused by inversion phenomenon can be prevented by controlling the energy gap of the SiGe:C space layer 250. Also, the leakage current can be minimized, and the diffusion coefficient and the concentration of oxygen at the interface when forming the insulating film 290 can be drastically reduced. Therefore, the end point can be easily controlled and the insulating film 290 can be also formed with uniform thickness. This technology of forming the insulating film 290 can prevent the diffusion of Ge and impurity, thus allows high gate operation characteristic. Also, as the generation of stress due to the lattice constant mismatch, crystal defects such as dislocation are not formed at the interface between the SiGe conduction layer 240 and the layers located upper and lower sides of the SiGe conduction layer 240. Therefore, in view of the energy band structure obtained when the conduction layer is formed between the source and drain by injecting carrier in the SiGe conduction layer 240, the conduction characteristic can be improved by concentrating the carrier in the SiGe conduction layer 240.

Figure 4A:
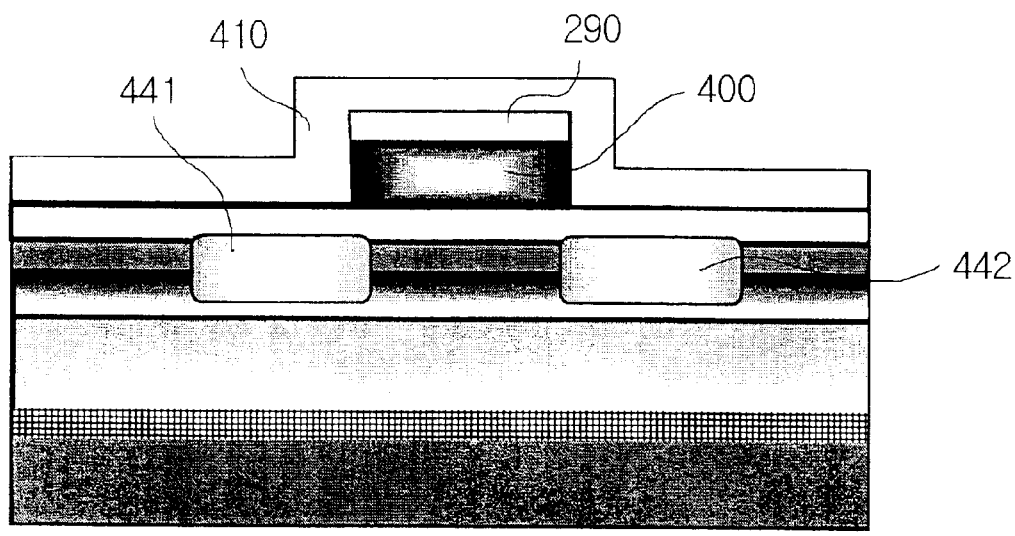
FIG. 4a is a cross-sectional view of a structure in which a gate is formed according to one embodiment of the present invention.
Figure 4B:
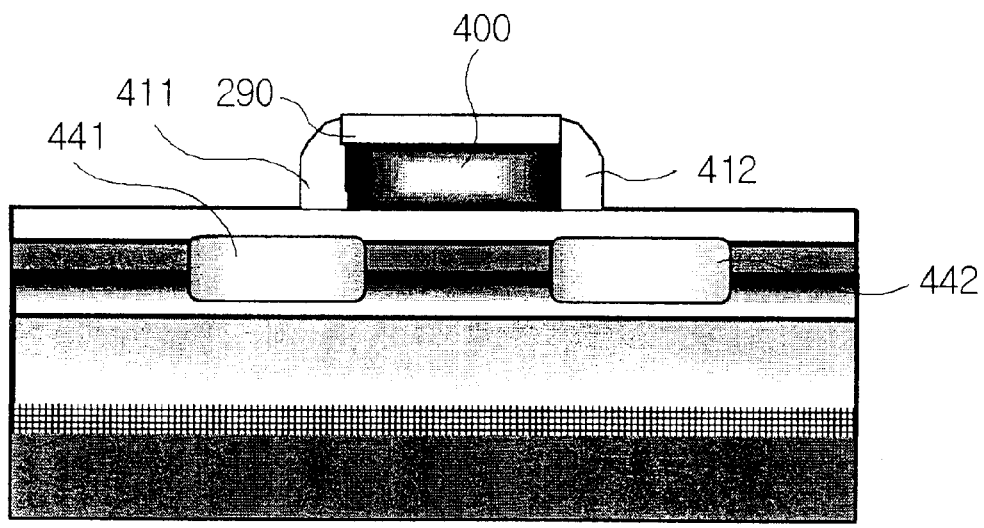
FIG. 4b is a cross-sectional view of a LDD ion-implanted structure after an oxide film is formed at the sidewall of a gate fabricated according to one embodiment of the present invention.
Figure 4C:
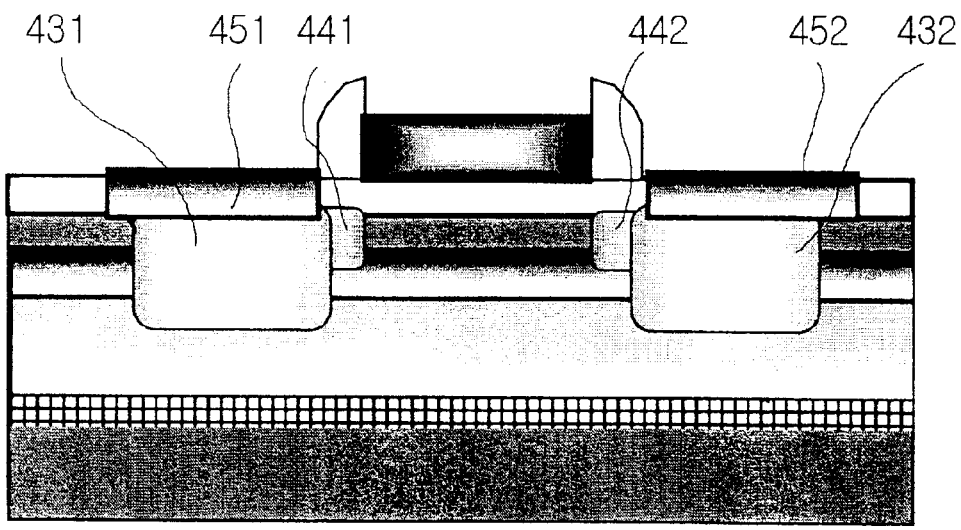
FIG. 4c is a cross-sectional view of a device in which a polysilicon layer of SiGe/Si or Si is grown in self-alignment manner for an ohmic contact of source-drain according to one embodiment of the present invention.
Figure 4D:
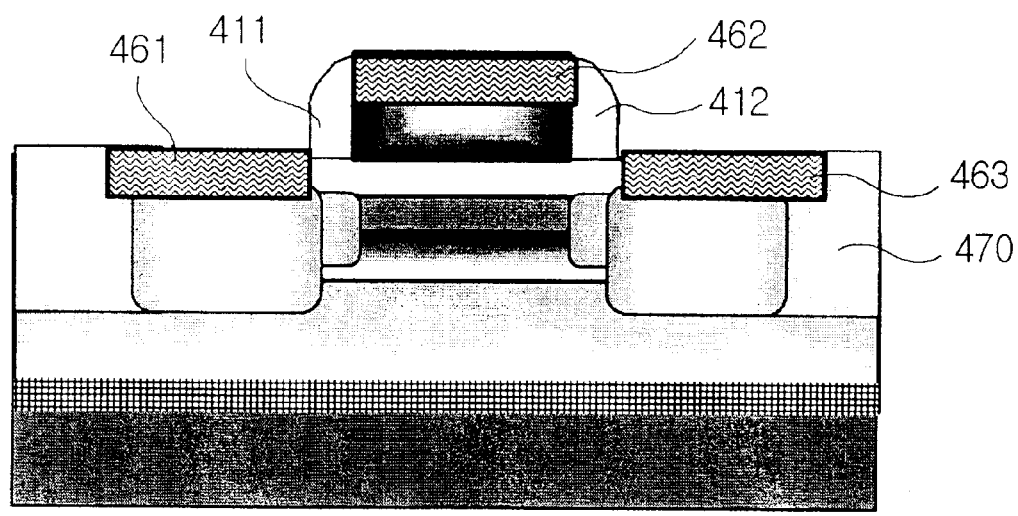
FIG. 4d is a schematic view of SiGe-MODFET in which a source, a gate and a drain are completed according to one embodiment of the present invention.

FIG. 4a is a cross sectional view of the insulating film 410 for defining a gate and for forming a dual sidewall, FIG. 4b is a cross-sectional view for forming dual sidewalls 411 and 412 according to one embodiment of the present invention, FIG. 4c is a cross-sectional view of the device in which an elevated source layer 451 and an elevated drain layer 452 are grown in self-alignment manner for ohmic contact of the source-drain according to one embodiment of the present invention, and FIG. 4d is a construction of a SiGe-MODFET in which the source silicide 461, the gate silicide 462 and the drain silicide 463 are completed according to one embodiment of the present invention.

Referring now to FIGS. 4a and 4b, a photosensitive film is applied and is then subjected to photolithography to define the SiGe gate 400. Then, the insulating film 290 is etched and is then dry-etched by plasma using a mixture gas of $SF_6$ and oxygen, thus forming the SiGe gate 400. The source-drain ion implantation layers 441 and 442 are self-aligned by LDD (lightly doped drain) ion implantation using the SiGe gate 400 as a mask. Next, the insulating film 410 is deposited with a thickness of 200 nm and is then subjected to photolithography process to expose the gate 400 and the device portion of the source-drain ion implantation layers 441 and 442. Then, it is subjected to dry etch to form the sidewall insulating films 411 and 412.

Referring now to FIG. 4c, there is shown a cross-sectional view of the device in which the gate sidewall insulating films 411 and 412 are formed, the photosensitive film for protecting the outside of the gate is removed is then subjected to cleaning and surface process, and the elevated-source layer 451 and the elevated-drain layer 452 are grown in self-aligned manner at the temperature of 650° C. for ohmic contact of the source-drain 431 and 432. At this time, the self-aligned elevated-source layer 451 and the elevated-drain layer 452 are formed with a thickness of 30~60 nm so that silicide can be sufficiently laminated, and an ohmic contact having a low contact resistance is formed in the elevated-source layer 451 and the elevated-drain layer 452 with Ti-silicide without being related to the source-drain 431 and 432 of p-type or n-type.

Referring now to FIG. 4d, there is shown a cross-sectional view of the device in which the protection insulating film 290 of the gate poly-silicon is removed by wet etch process in phosphoric acid solution, and a Ti/TiN metal thin film is deposited by sputtering process, then subjected to an annealing process to form ohmic contact with titanium-silicide, thus completing the self-aligned source silicide 461, gate silicide 462 and drain silicide 463. When Ti/TiN is deposited by sputtering process, the surface of the wafer is subjected to plasma process using an inversed bias, and Ti and TiN is deposited with a thickness of 20~40 nm and 30~60 nm, respectively, at the temperature of 500° C. The annealing process of the Ti silicide includes a step of performing at the temperature of 600~710° C. for 1 minute to form the phase C49 and removing metal Ti which has not formed silicide by etching in $NH_4OH$ solution, a second step of performing annealing process at the temperature of 780~900° C. to change phase C49 into phase C52, the resistivity of which is about one fifth of that of C49. Then, a device isolation ion implantation layer 470 for electrically isolating the surrounding devices is formed by performing high energy and high concentration ion implantation or dry etching using trench isolation method, and depositing an oxide film.

A method of fabricating SiGe MODFET using an oxide film according to the present invention provides a MODFET having a MOS gate using a hetero-junction structure of SiGe:C and SiGe/Si. Therefore, it can reduce the power consumption and the delay time of the device to about one forth and also can improve the linear characteristic of CMOS. Also, as a SiGe Bi-CMOS structure can be easily fabricated by combining the MODFET and HBT, the present invention can provide a ultra-micro Si semiconductor having advantages such as low driving voltage below 2V, exact controllability of the threshold voltage, low consumption power, etc. Therefore, as the present invention can be implemented in RFIC, MMIC, DRAM, Processor, OEIC and System-on-Chip using the operating characteristic of several tens of Giga-byte ULSI and several tens of Giga-Hz, it can be utilized to merge various types of semiconductor devices.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A SiGe MODFET device including a silicon buffer layer, a SiGe channel layer and a silicon cap layer sequentially formed on a silicon substrate, being characterized by further comprising:

a second silicon buffer layer and a SiGe buffer layer sequentially formed between said silicon buffer layer and said SiGe channel layer, wherein said second buffer layer and said SiGe buffer layer are formed at a temperature lower than that is used to form said silicon buffer layer so that the defects caused by the mismatch of the lattice constants of each of said layers are constrained within said second buffer layer and said SiGe buffer layer.

2. The SiGe MODFET device according to claim 1, wherein said defects due to the mismatch of the lattice constants are constrained to propagate in the direction of said silicon substrate.

3. The SiGe MODFET device according to claim 1, wherein a 2-dimensional carrier layer through which carriers move and a SiGe conduction layer are sequentially formed between said SiGe buffer layer and said silicon cap layer.

4. The SiGe MODFET device according to claim 3, wherein a SiGe:C space layer is formed between said SiGe conduction layer and said silicon cap layer, and said silicon cap layer is oxidized using metal deposition and rapid thermal annealing to provide a gate oxide layer including metal-oxides.

5. The SiGe MODFET device according to claim 4, wherein the thickness of said gate oxide layer is controlled so that the distance between the source-drain regions in said channel layer and said SiGe conduction layer is reduced to increase the breakage-down voltage and to suppress non-linear characteristic and leakage current of the device.

6. The SiGe MODFET device according to claim 4, wherein said SiGe:C space layer is formed by using a plasma source gas for dissolving methane gas so that the layer may grow at a relatively low temperature.

7. The SiGe MODFET device according to claim 6, wherein a voltage of 50–300 V is applied to said silicon substrate to accelerate carbon ions or hydrogen ions generated by said plasma, so that surface reaction easily occurs and the combination of Si—C and Ge—C are formed at a relatively low temperature.

8. The SiGe MODFET device according to claim 1, wherein the growth of said SiGe buffer layer is performed by using multi-step continuous growth method in which the mole fraction of Ge is gradually increased.

9. The SiGe MODFET device according to claim 1, wherein a junction resistance of the device is reduced by the formation of elevated source-drain regions and self-aligned silicide, thereby reducing the parasitic component of the electrostatic capacity and improving the operating speed.

* * * * *